US00RE35934E

United States Patent [19]

Takai

[11] E Patent Number: Re. 35,934

[45] Reissued Date of Patent: Oct. 27, 1998

[54] SEMICONDUCTOR MEMORY DEVICE SYNCHRONOUS WITH EXTERNAL CLOCK SIGNAL FOR OUTPUTTING DATA BITS THROUGH A SMALL NUMBER OF DATA LINES

[75] Inventor: Yasuhiro Takai, Tokyo, Japan

[73] Assignee: NEC Corporation, Tokyo, Japan

[21] Appl. No.: 879,516

[22] Filed: Jun. 20, 1997

Related U.S. Patent Documents

Reissue of:

[64] Patent No.: 5,426,606
Issued: Jun. 20, 1995
Appl. No.: 221,574
Filed: Apr. 1, 1994

[30] Foreign Application Priority Data

Apr. 2, 1993 [JP] Japan ..... 5-077236

[51] Int. Cl.[6] ..... G11C 8/00

[52] U.S. Cl. ..... 365/189.05; 365/230.06; 365/230.08; 365/233

[58] Field of Search ..... 365/189.05, 230.06, 365/230.08, 233

[56] References Cited

U.S. PATENT DOCUMENTS

| | | | |
|---|---|---|---|
| 4,856,106 | 8/1989 | Teraoka | 365/203 |
| 5,047,984 | 9/1991 | Monden | 365/203 |
| 5,341,341 | 8/1994 | Fukuzo | 365/189.05 X |

FOREIGN PATENT DOCUMENTS

| | | |
|---|---|---|
| 0393436 | 10/1990 | European Pat. Off. . |
| 62-1182 | 11/1987 | Japan . |

*Primary Examiner*—Do Hyun Yoo
*Attorney, Agent, or Firm*—Sughrue, Mion, Zinn, Macpeak & Seas, PLLC

[57] ABSTRACT

A synchronous dynamic random access memory device allows an external device to sequentially access read-out data bits in synchronous with a system clock signal, and a column addressing system incorporated in the synchronous dynamic random access memory device forms a plurlaity of pipeline stages together with an input/output unit for sequentially supplying data bits to a data port in response to a column address internally incremented in synchronism with the system clock signal, thereby propagating the data bits through a single data bus.

30 Claims, 12 Drawing Sheets

SEMICONDUCTOR MEMORY DEVICE SYNCHRONOUS WITH EXTERNAL CLOCK SIGNAL FOR OUTPUTTING DATA BITS THROUGH A SMALL NUMBER OF DATA LINES

Matter enclosed in heavy brackets [ ] appears in the original patent but forms no part of this reissue specification; matter printed in italics indicates the additions made by reissue.

FIELD OF THE INVENTION

This invention relates to a semiconductor memory device synchronous with an external clock signal and, more particularly, to a semiconductor memory device such as, for example, a dynamic random access memory device synchronous with a system clock of an electronic system.

DESCRIPTION OF THE RELATED ART

A typical example of the semiconductor memory device is illustrated in FIG. 1 of the drawings, and is of a synchronous dynamic random access memory device. The synchronous dynamic random access memory device largely comprises a memory cell array 1, a mode-establishing system 2, a row addressing system 3, a column addressing system 4, a data input/output system 5 and an internal timing generator 6, and is responsive to an external command code for establishing an operation mode therein. Namely, the synchronous dynamic random access memory device has a first option in a CAS latency, a second option in a burst length and a third option between a sequential burst and a interleave burst. The CAS (Column Address Strobe) latency is indicative of the number of clocks from a read command code READ, indicative of a read-out instruction, to the first data output, and the burst length is the number of column addresses sequentially selected on the basis of an external column address signal. In the sequential burst, the lower bits of the internal column address signal is sequentially incremented, and the interleave burst causes the lower bits to change in an interleave manner. For example, if the external column address signal has the lower bits indicative of "0", the lower bits are changed so as to sequentially indicate "0", "1","2" and "3" in the sequential burst on the other hand, if the interleave burst is selected, the lower bits are changed in such a manner as to indicate "1", "0","3" and "2" on the basis of the external column address signal having the lower bits indicative of "1". In the synchronous dynamic random access memory device shown in FIG. 1, the CAS latency and the burst length are assumed to be adjusted to "3" and "4", and the sequential burst is assumed to be selected.

A burst access through the sequential or interleave burst improves an average access time to each data bit. A non-synchronous dynamic random access memory device achieves an access time of 60 nano-second. However, a synchronous dynamic random access memory device can achieve an average access time of 30 nano-second under the conditions of a system clock at 100 MHz and the CAS latency at 3, a system clock at 66 MHz and the CAS latency of 2 or a system clock at 33 MHz and the CAS latency of 1.

The synchronous dynamic random access memory device selectively enters into a programming mode, a read-out mode, a write-in mode and a refreshing mode. In the programming mode, the CAS latency and the burst length are adjusted to respective values, and either sequential or interleave burst is selected. While the read-out mode is being established in the synchronous dynamic random access memory device, a predetermined number of data bits represented by the burst length is read out from the memory cell array 1. On the other hand, a write-in data bit is written into the memory cell array 1 in the write-in mode. The refreshing mode allows the row addressing system 3 to sequentially read out the data bits stored in the memory cell array 1, and the read-out data bits are amplified before being restored.

The memory cell array I comprises a plurality of dynamic random access memory cells M11, . . . , Mm1, . . . . , M1n, . . . and Mmn arranged in rows and columns, a plurality of word lines WL1 to WLm coupled with the rows of dynamic random access memory cells, respectively, a plurality of bit line pairs BL1 to BLn coupled with the columns of dynamic random access memory cells, respectively, and a row of sense amplifier circuits SA1 to SAn.

The dynamic random access memory cells M11 to Mmn store respective data bits, and the data bits are accessible and rewriteable through the data input/output system 5. The data bits are stored in the form of electric charge, and produce potential differences on the respective bit line pairs BL1 to BLn.

The mode-establishing system 2 has a command register 2a coupled with a command port CD1 assigned to a mode register set command code and other external command codes described hereinbelow. Namely, when a user establishes or changes the operation mode in the synchronous dynamic random access memory device, the mode register set command code is supplied through the command port CD1 to the command register 2a, and the command register thus enabled with the mode register set command code latches a bit string supplied through an address port AD1. Then, the command register 2a adjusts the CAS latency and the burst length to respective values, and selects either sequential or interleave burst. In this instance, an internal control signal CTL1 is indicative of the burst length, and another internal control signal CTL2 is indicative of the sequential or interleave burst. The internal control signals CTL1 and CTL2 are supplied to the internal timing generator 6, and the internal timing generator 6 produces appropriate internal control signals to the column addressing system 4. The command register 2a is further responsive to external command codes ACTIVE, READ and PRECHARGE, and informs the internal timing generator 6 of a latch of each external command codes ACTIVE, READ, PRECHARGE through an internal control signals CTL3.

The row addressing system 3 comprises a first stage 3a coupled with the address port AD1, an input buffer unit 3b coupled with the first stage 3a and responsive to a latch control signal LTC1 for storing an external row address signal and an external column address signal, a row address predecoder unit 3c coupled with the input buffer unit 3b for producing row address predecoded signals, a row address latching unit 3d coupled with the row address predecoder unit 3c and responsive to a latch control signal LTC2 for storing the row address predecoded signals, and a row address decoder/word line driver unit 3e coupled with the row address latching unit 3d for energizing one of the word lines WL1 to WLm.

When the external command code ACTIVE is latched by the command register 2a, the internal timing generator 6 changes the control signal LTC2 to an active level, and the row addressing system 3 starts a row address decoding sequence for energizing one of the word lines WL1 to WLm. On the other hand, when an external command PRECHARGE is latched by the command register 2a, the row addressing system 3 resets all of the word lines WL1 to WLm, and a precharging unit (not shown) charges and balances the bit line pairs BL1 to BLn.

The column addressing system 4 comprises first and second column address buffer units 4a and 4b for storing the internal column address signal, a plurality of column address decoder/selector units 41 , 42, 43, 44 each responsive to the column address bits of the internal column address signal for selecting one of the bit line pairs BL1 to BLn, and a selector unit 4d having two pairs of selector circuits 45/46 and 47/48. The second column address buffer unit 4b has an address incrementor, and is responsive to the lower two column address bits of the internal control signals for a selected burst length in either sequential or interleave manner.

Each of the plurality of column address decoder/selector units 41 to 44 are associated with the bit line pairs BL1 to BLn, and is broken down into a column address decoder section 4e, a read amplifier 4f for developing a potential difference indicative of a read-out data bit, a read-out circuit 4g responsive to a first column address decoded signal for coupling the associated bit line pair with the read amplifier 4f, a write amplifier 4h for developing a potential difference indicative of a write-in data bit, a write-in circuit 4i also responsive to the first column address decoded signal for coupling the write amplifier 4h with the associated bit line pair and a switching circuit 4j responsive to a second column address decoded signal of the internal column address signal for providing a data path between an associated data line pair and the read and write amplifiers 4f and 4h.

If the internal column address signal is indicative of the bit line pair BL1 in the read-out mode, the decoder sections 4e cause the read-out circuits 4g to couple the bit line pair BL1 and related three bit line pairs with the read amplifiers 4f, and allow the switching circuits 4j to couple the read amplifiers 4f with associated data line pairs. The second column address buffer unit 4b sequentially increments the value indicated by the lower two bits of the internal column address signal, and the pair of selector circuits 45/46 is responsive to the lower two column address bits for sequentially transferring the four read-out data bits. Thus, the four bit line pairs are previously selected by the higher column address bits of the internal column address signal, and the second column address buffer unit 4b causes the pair of selector circuits 45/46 to sequentially transfer the four read-out data bits in response to the increments of the value of the lower two column address bits.

The data input/output system 5 comprises four data line pairs 5a, 5b, 5c and 5d coupled between the column address decoder/selector units 41 to 44 and the two pairs of selector circuits 45, 46, 47 and 48, two delay-flip-flop circuits 5e for storing a potential difference passing through the associated pair of selector circuits 45 and 46, an output data buffer unit 5f for producing an output data signal at an input/output data port DP1 from the potential difference stored in the delay-flip-flop circuits 5e, an input data buffer circuit 5g for storing an input data signal at the input/output data port DP1, a data latch circuit 5h for storing the input data signal and a write buffer unit 5i for producing a potential difference from a write-in data bit indicated by the input data signal. The write buffer unit 5i supplies the potential difference indicative of the write-in data bit through the other pair of selector circuits 47 and 48 to one of the data line pairs 5a to 5d.

The delay-flip-flop circuits 5e are symboled with a box labeled with "D", "C" and "Q" as shown in FIG. 2A, and each of the delay-flip-flop circuits 5e is broken down into a latch section 5j and an output section 5k. The latch section 5j has two transfer gates TG1 and TG2 complementarily switched between on-state and off-state, a pair of inverters INV1 and INV2 forming a memory loop and an inverter INV3 for producing the complementary voltage of the voltage level at the node C. The output section 5k also has two transfer gates TG3 and TG4 also complementarily switched between on-state and off-state and a pair of inverters INV4 and INV5 for keeping a voltage level transferred from the latch section 5j.

When the node C is changed to the low level, the transfer gate TG1 turns on, and the transfer gate TG2 turns off so that the voltage level at the node D reaches the input node of the inverter INV1. Subsequently, the node C is changed to the high voltage level, the transfer gate TG1 isolates the inverter INV1 from the node D, and the transfer gate TG2 allows the inverters INV1 and INV2 to keep the voltage level at the node D. Moreover, the high voltage level allows the transfer gate TG3 to turn on, and the transfer gate TG4 turns off. As a result, the voltage level at the node D is maintained in the memory loop, and reaches the input node of the inverter INV4.

If the node C goes down to the low voltage level again, the transfer gate TG3 isolates the inverter INV4 from the latch section 5j, and the transfer gate TG4 allows the inverters INV4 and INV5 to keep the previously latched voltage level at the node Q.

The prior art synchronous dynamic random access memory device thus arranged behaves in the read-out mode as follows. FIG. 3 illustrates the burst access of the prior art synchronous dynamic random access memory device, and C1 to C14 are respectively indicative of the leading edges of the system clock signal supplied from the outside of the synchronous dynamic random access memory device.

Assuming now that a microprocessor (not shown) of the electronic system supplies an external row address signal and the external command code ACTIVE to the command port CD1 and the address port AD1, respectively, the command register 2a and the input buffer unit 3b latch the external command code ACTIVE and the external row address signal in response to the latch control signal LTC1 at C1, and the row address predecoder unit 3c predecodes an internal row address signal ROW produced from the external row address signal already stored in the input buffer unit 3b. The external command code ACTIVE causes the internal timing generator 6 to start the row addressing sequence.

Namely, the row address predecoded signals are latched by the row address latching unit 3d in response to the latch control signal LTC2. The row address predecoded signals are decoded by the row address decoder unit 3e, and the word line WLm is, by way of example, energized to the active high level between C1 and C2. The row of memory cells Mm1 to Mmn coupled with the word line WLm are activated, and the data bits are read out from the memory cells Mm1 to Mmn to the bit line pairs BL1 to BLn, respectively. The bit line pairs BL1 to BLn have been already balanced at an intermediate voltage level, and small potential differences take place on the bit line pairs BL1 to BLn, respectively. The bit line pairs BL1 to BLn propagate the small potential differences to the row of sense amplifier circuits SA1 to SAn, and the sense amplifier circuits SA1 to SAn develop the potential differences.

The microprocessor (not shown) further supplies the external command code READ and the external column address signal to the command port CD1 and the address port AD1, respectively. The external command code READ is latched by the input buffer unit 3b in response to the latch control signal LTC1 at C4, and the input buffer unit 3b concurrently latches the external column address signal. The command register 2a causes the internal timing generator 6 to start a column addressing sequence, and the external column address signal is transferred from the input buffer unit 3b to the column address buffer units 4a and 4b as an internal column address signal A0.

The column address buffer units 4a and 4b latch the internal column address signal A0 at C5, and supplies the lower two column address bits and the higher column address bits to the selector unit 4d and the decoder sections 4e.

With the higher column address bits, the NAND gates NA2 selects four bit line pairs sharing the higher column address bits, and the NAND gates NA1 of the column address decoder/selector units cause the four switching elements 4j to turn on. The internal timing generator 6 causes the second column address buffer unit 4b to sequentially increment the internal column address signal to A1, A2 and A3 at C6, C7 and C8, and, accordingly, the selector circuits 45/46 allow the read-out data bits transferred from the bit line pairs assigned the column addresses A0 to A3 to pass therethrough. The four read-out data bits are sequentially latched by the delay-flip flop circuits 5e, and are transferred from the delay-flip-flop circuits 5e through the output data buffer 5f to the data port DP1 at C7, C8 and C9.

If the microprocessor (not shown) supplies the external command code READ and the external column address signal to the command port CD1 and the address port AD1 at C8, the synchronous dynamic random access memory device repeats the burst access. However, the timing chart illustrates the burst access with the internal column address signal B0 in the inter-leave manner.

The synchronous dynamic random access memory device thus arranged encounters a problem in the complex arrangement of the data line pairs 5a, 5b, 5c and 5d. This is because of the fact that the selector circuits 45 and 46 sequentially transfer the read-out data bits on the data line pairs 5a to 5d.

SUMMARY OF THE INVENTION

It is therefore an important object of the present invention to provide a semiconductor memory device synchronous with an external clock signal which is simple in arrangement of data lines.

To accomplish the object, the present invention proposes to transfer read-out data bits to a single data line pair in synchronism with an address increment.

In accordance with the present invention, there is provided a semiconductor memory device comprising: a) a memory cell array having a plurality of addressable memory cells for storing a plurality of data bits selectively assigned with row addresses and column addresses; b) a row addressing system responsive to an external row address signal indicative of one of the row addresses for selecting accessible memory cells from the plurality of addressable memory cells: c) a timing controller for producing a plurality of internal control signals for sequentially supplying data bits selected from the plurality of data bits to the outside of the semiconductor memory device; d) an interface unit coupled with a data port for transferring the data bits to the outside of the semiconductor memory device; e) a single shared data bus coupled with the interface unit for sequentially propagating the data bits to the interface unit; and f) a column addressing system coupled with the single shared data bus, and having f-1) a column address buffer subsystem operative to store the aforesaid one of the column addresses represented by the external column address signal, and responsive to first internal control signals of the plurality of internal control signals for changing the aforesaid one of the column addresses predetermined times, and f-2) a column address decoder/selector sub-system forming a plurality of pipeline stages together with the interface unit, the plurality of pipeline stages being responsive to second internal control signals of the plurality of internal control signals so as to successively transfer the data bits identified by the aforesaid one of the column addressees and column addresses changed by the column address buffer sub-system through the single shared data bus to the data port.

The column address may be changed in a sequentially manner or in an interleave manner.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 1:
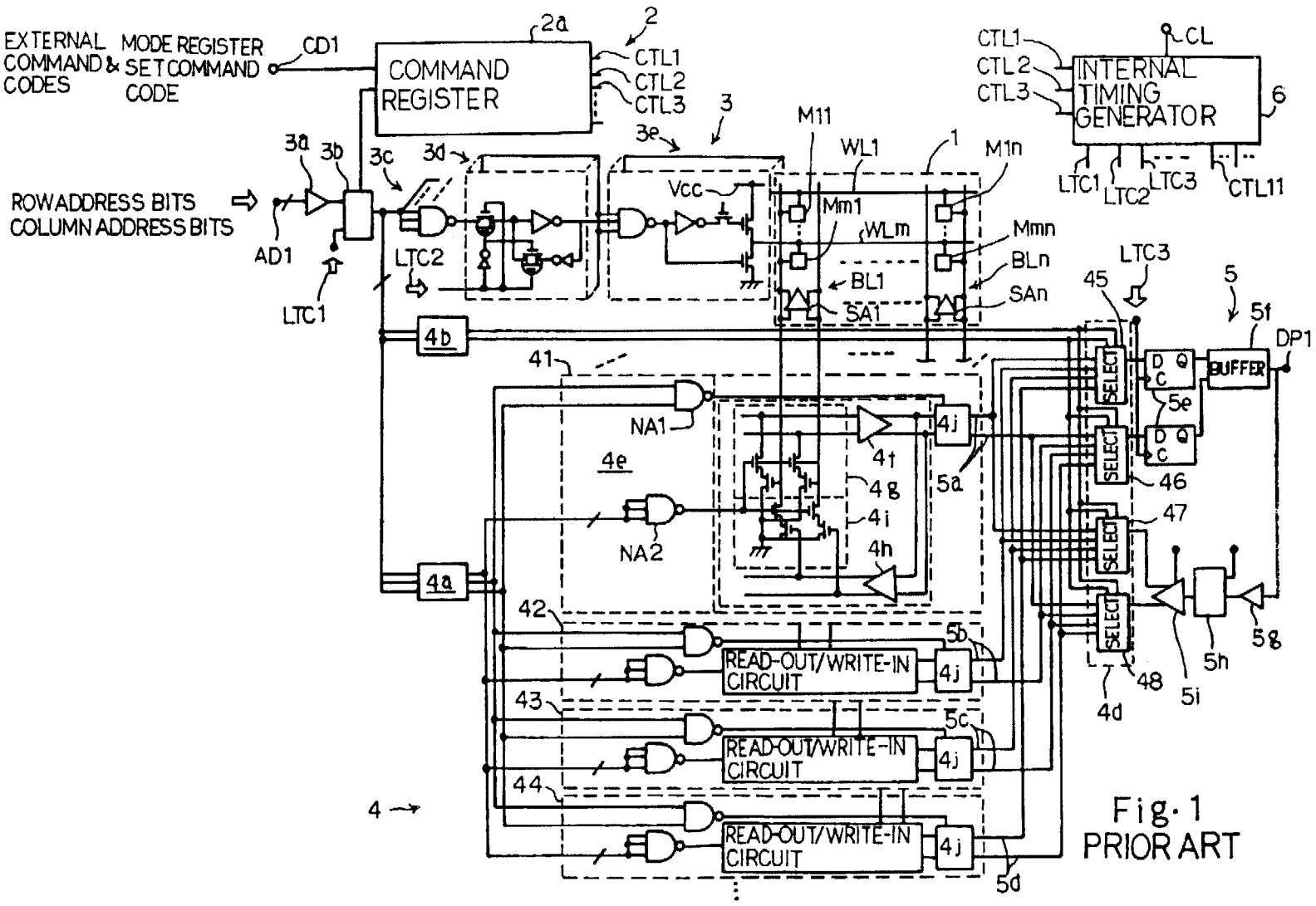
Fig. 1 PRIOR ART
FIG. 1 is a circuit diagram showing the arrangement of the prior art synchronous dynamic random access memory device.
Figure 2A:
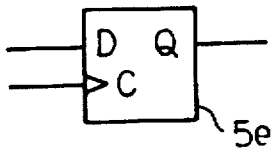
Fig. 2A PRIOR ART
FIG. 2A is a view showing the symbol of a delay-flip-flop circuit incorporated in the prior art synchronous dynamic random access memory device.
Figure 2B:
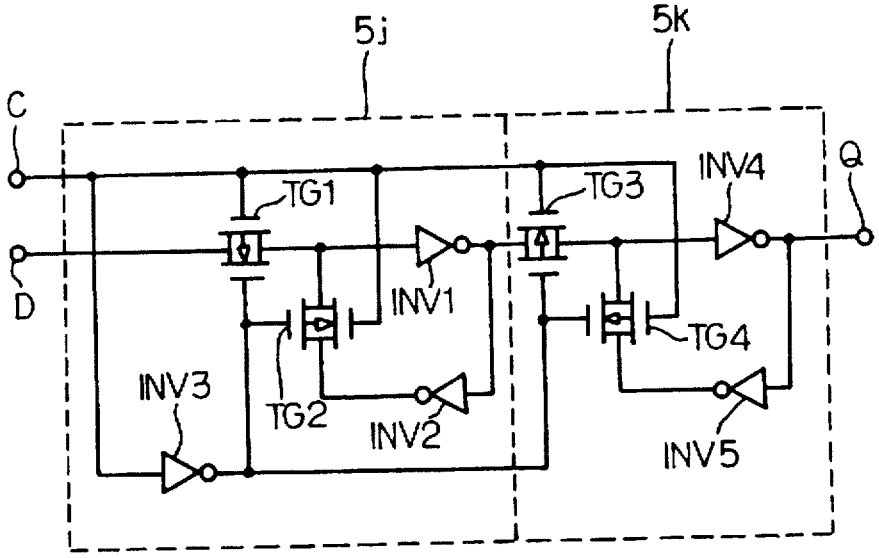
Fig. 2B PRIOR ART
FIG. 2B is a circuit diagram showing the arrangement of the prior art delay-flip-flop circuit.
Figure 3:
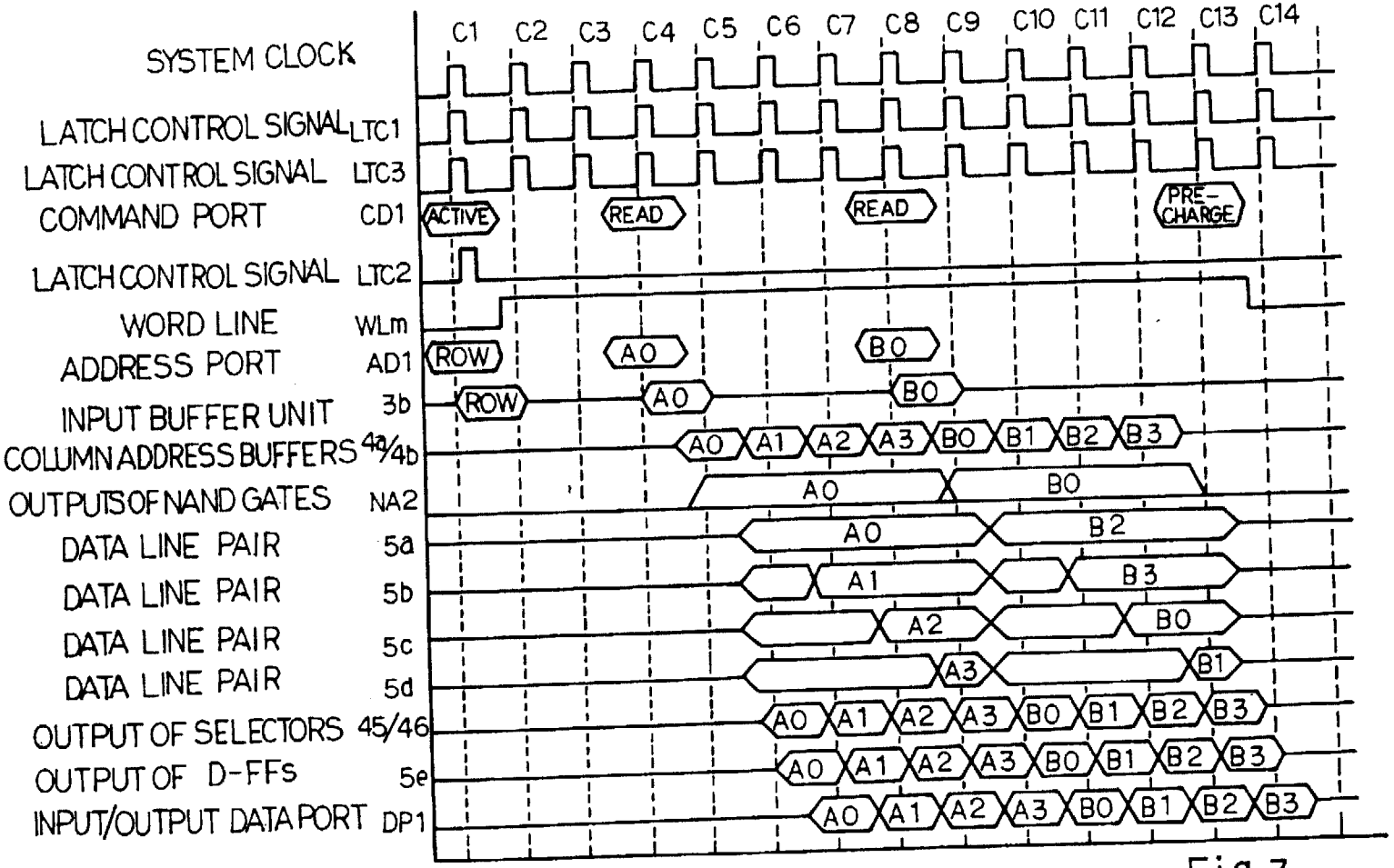
Fig.3 PRIOR ART
FIG. 3 is a timing chart showing a burst access to the prior art synchronous dynamic random access memory device.
Figure 4:
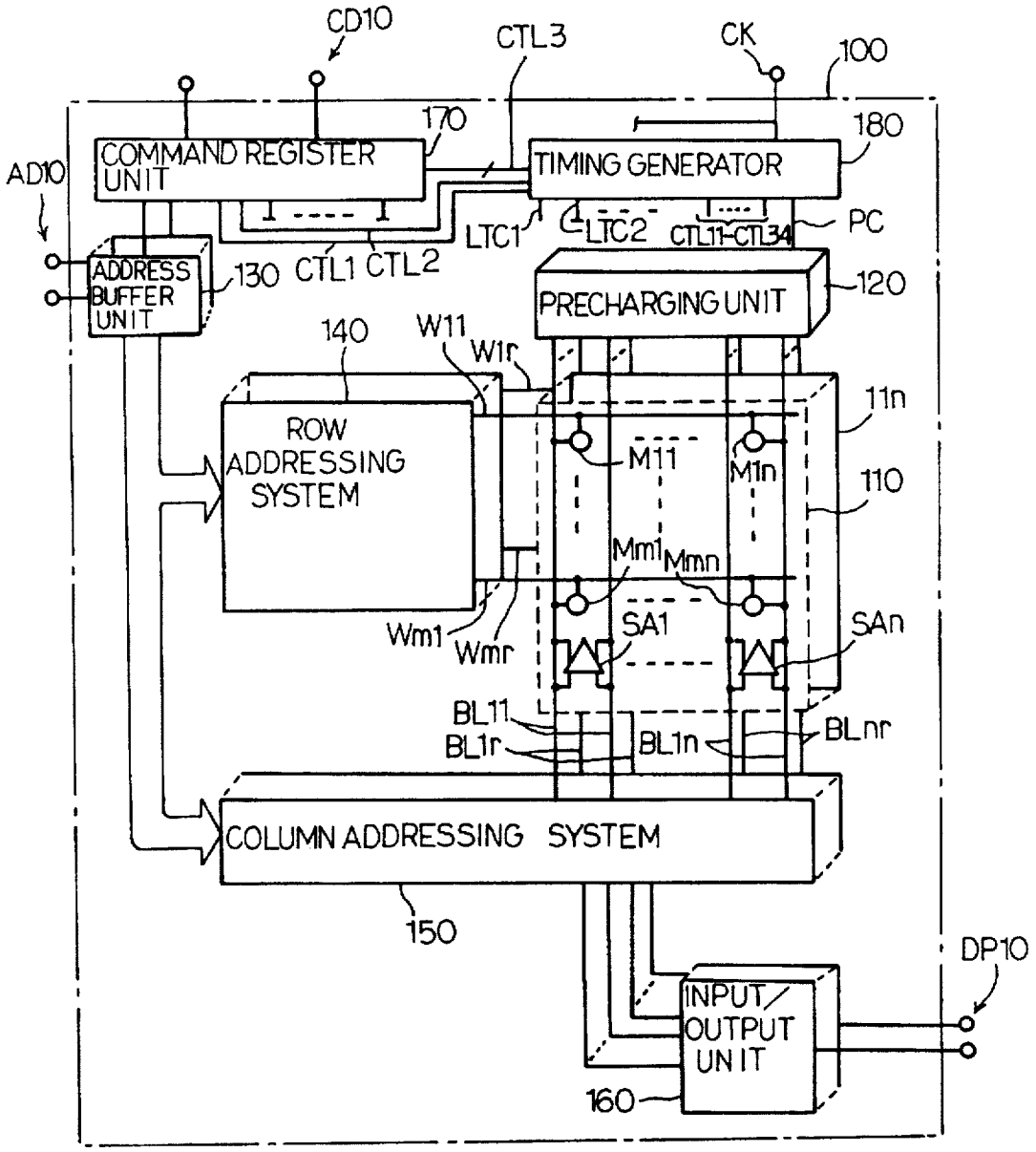
FIG. 4 is a block diagram showing the arrangement of a synchronous dynamic random access memory device according to the present invention.

Referring to FIG. 4 of the drawings, a synchronous dynamic random access memory device embodying the present invention is fabricated on a single semiconductor chip 100, and largely comprises a plurality of memory arrays 110, a precharging unit 120, an address buffer unit 130, a row addressing system 140, a column addressing system 150, an input/output unit 160, a command register unit 170 and a timing generator 180. The synchronous dynamic random access memory device selectively enters into a programming mode, a read-out mode, a write-in mode and a refreshing mode as similar to the prior art synchronous dynamic random access memory device. An n-bit input data signal is supplied from, for example, a microprocessor (not shown) of an electronic system through an input and output data port DP10 to the input/output unit 160, and the input/output unit 160 supplies an n-bit output data signal through the input and output data port DP10 to the microprocessor.

In the programming mode, a mode-register-set command code is supplied through a command port CD10 to the command register unit 170, and the command register unit 170 sets a CAS latency and a burst length by values indicated by bit strings supplied from an address port AD10 through an address buffer unit 130 thereto. The command register unit 170 further sets either sequential or interleave burst for a burst access.

The function in the refreshing mode is well known to a person skilled in the art, and no further description is incorporated hereinbefore for the sake of simplicity.

The plurality of memory cell arrays 110 to 11n are similar to each other, and each of the memory cell arrays 110 to 11n comprises a plurality of dynamic random access memory cells M11, . . . , Mm1, . . . , M1n, . . . and Mmn arranged in rows and columns, a plurality of word lines W11/W1r to Wm1/Wmr coupled with the rows of dynamic random access memory cells M11 to Mmn, respectively, a plurality of bit line pairs BL11/BL1r to BL1n/BLnr coupled with the columns of dynamic random access memory cells M11 to Mmn, respectively, and a row of sense amplifier circuits SA1 to SAn.

The dynamic random access memory cells M11 to Mmn store respective data bits, and the data bits are accessible and rewriteable in the read-out and write-in modes. The data bits are stored in the form of electric charge, and produce potential differences on the respective bit line pairs BLP11/BL1r to BLP1n/BLnr.

The command register 170 behaves as similar to the command register 2a, and produces the internal control signals CTL1, CTL2, CTL3 etc. The internal control signal CTL1 is indicative of the burst length, and the internal control signal CTL2 is indicative of the sequential or interleave burst. The internal control signals CTL1 and CTL2 are supplied to the internal timing generator 180, and the internal timing generator 180 produces internal control signals on the basis of the internal control signals CTL1 and CTL2 for controlling the column addressing system 150.

The command register 170 is further responsive to external command codes ACTIVE, READ and PRECHARGE, and informs the internal timing generator 6 of a latch of each external command codes ACTIVE, READ, PRECHARGE through internal control signals CTL3.

An external system clock is supplied from a clock pin CK to the internal timing generator 180, and sequentially produces internal control signals so as to control a row addressing sequence, a sense amplification, a column addressing sequence, a data output sequence and a reset and precharging sequence. These sequences will be described hereinlater in detail.

As described hereinbefore, the synchronous dynamic random access memory device embodying the present invention is communicable with the microprocessor (not show) by using the n-bit input/output data signals. For this reason, each of the row addressing system 140, the column addressing system 150 and the input/output unit 160 is broken down into sub-systems or sub-units respectively associated with the memory cell arrays 110 to 11n, and the sub-systems or the sub-units are similar in arrangement to one another. For this reason, description is hereinbelow made on only one set of the address buffer sub-unit 131, the row addressing sub-system 141, the column addressing sub-system 151, the input/output sub-unit 161 associated with the memory cell array 110 with reference to FIG. 5 of the drawings.

Figure 5:
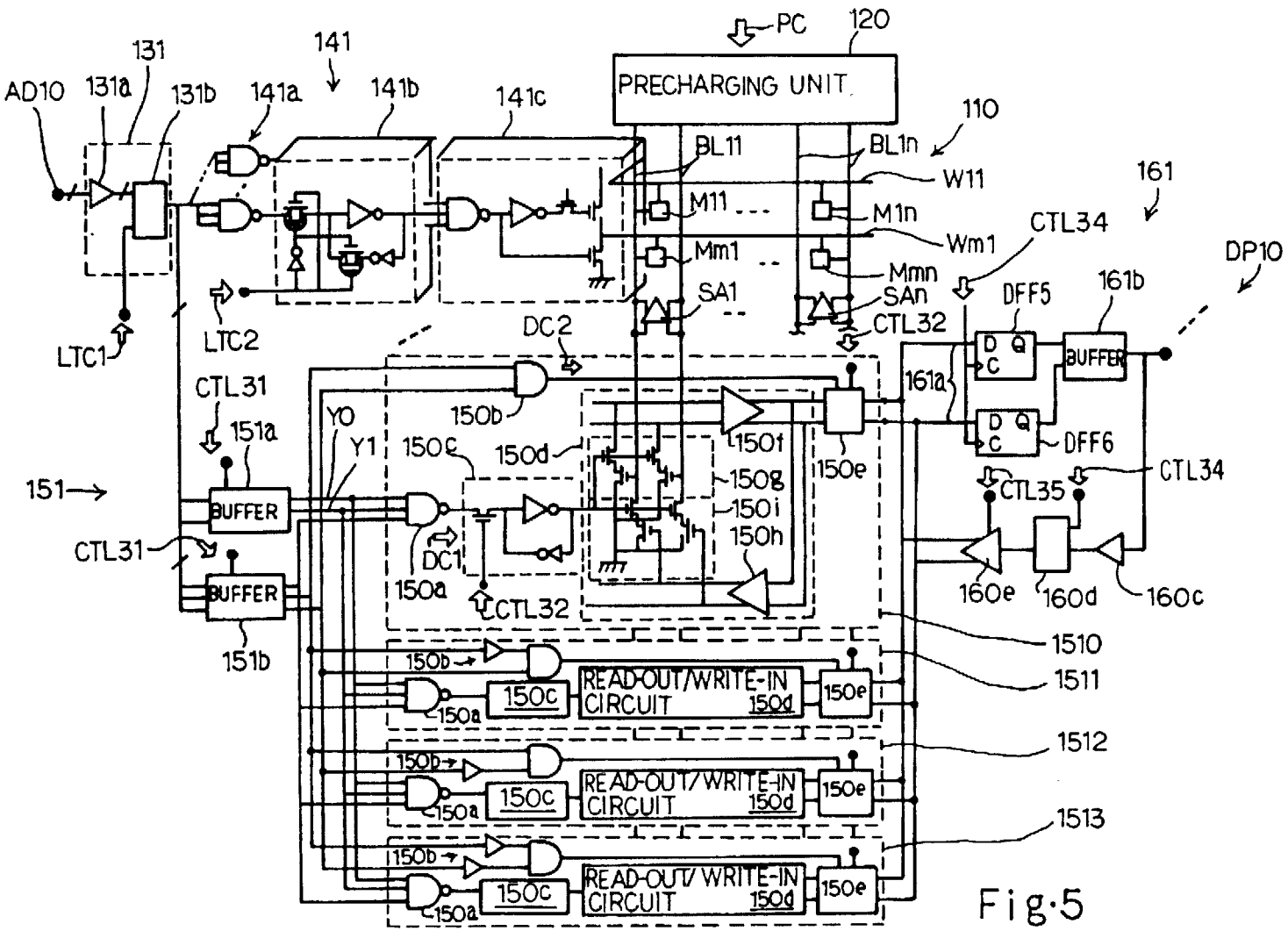
FIG. 5 is a circuit diagram showing sub-systems and sub-units associated with one of the memory cell arrays incorporated in the synchronous dynamic random access memory device according to the present invention.

Turning to FIG. 5 of the drawings, the address buffer sub-unit 131 comprises a first input stage 131a coupled with the address port AD10 and an input buffer 131b responsive to the latch control signal LTC1 for storing an external row address signal and an external column address signal in the read-out and write-in modes. The external row address signal is indicative of a row address assigned to one of the word lines W11 to W1r, and the external column address signal is indicative of a column address assigned to one of the bit line pairs BL11 to BL1n.

The row addressing sub-system 141 comprises a row address predecoder 141a coupled with the input buffer 131b for producing row address predecoded signals, a row address latch 141b coupled with the row address predecoder 141a and responsive to the latch control signal LTC2 for storing the row address predecoded signals and a row address decoder/word line driver 141c coupled with the row address latch 141b and response to the row address predecoded signals for energizing one of the word lines W11 to Wm1.

When the external command code ACTIVE is latched by the command register unit 170, the internal timing generator 180 sequentially produces the related internal control signals, and the row addressing system 140 starts a row address decoding sequence with the latch control signal CTL2. On the other hand, when an external command code PRECHARGE is latched by the command register unit 170, the row addressing sub-system 141 resets all of the word lines W1 to Wm, and the internal timing generator 180 causes the precharging unit 120 to charge and balance the bit line pairs BL11 to BL1n.

The column addressing sub-system 151 comprises column address buffers 151a and 151b for storing the internal column address signal supplied from the input buffer 131b and a plurality of column address decoder/selector units 1510, 1511, 1512 and 1513, . . . associated with the bit line pairs BL11 to BL1n. The column address decoder/selector units 1510 to 1513 are responsive to the column address bits of the internal column address signal for selectively coupling the bit line pairs BL11 to BL1n of the associated memory cell array 110 with the input/output sub-unit 161.

Figure 6:
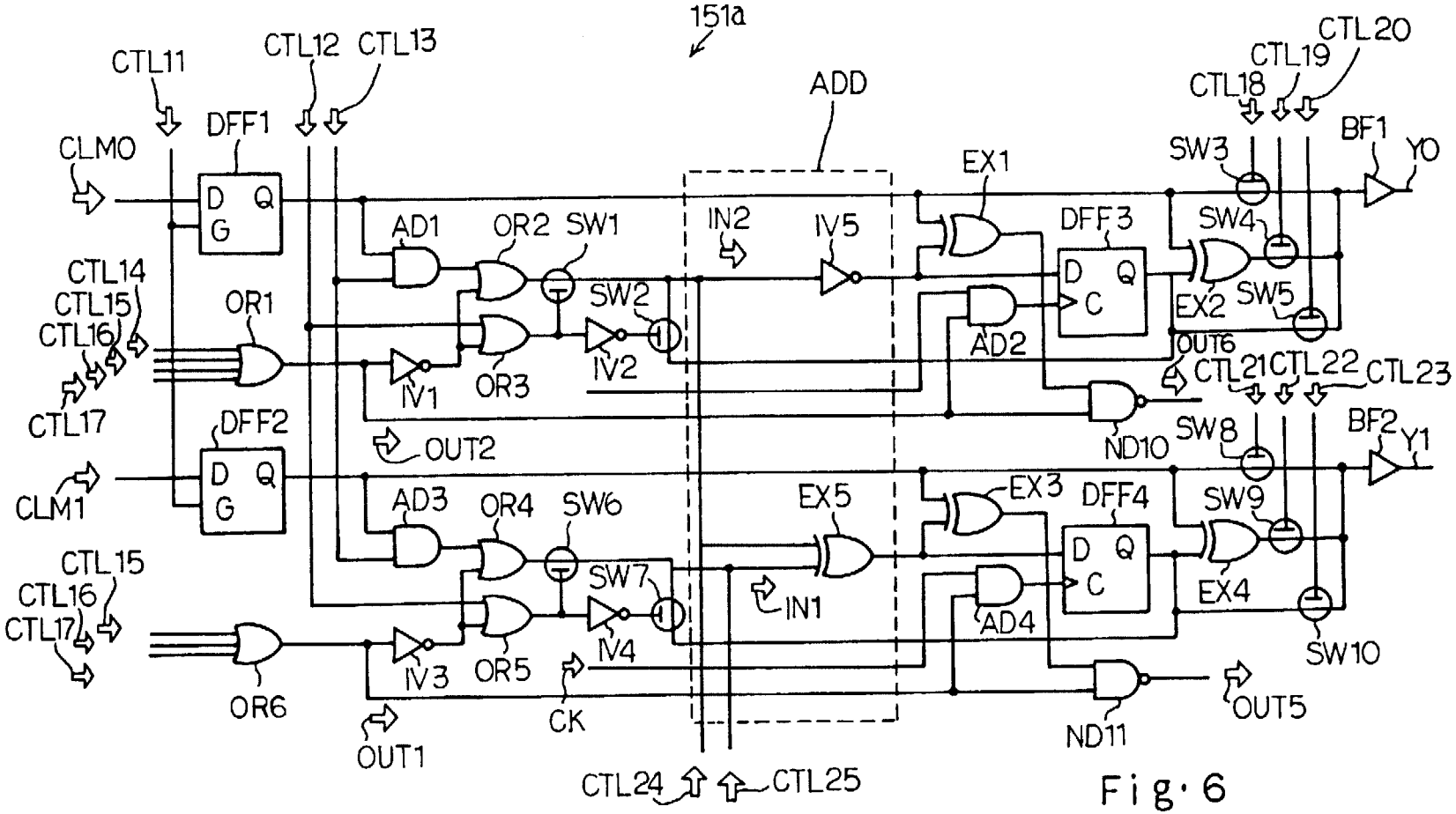
FIG. 6 is a circuit diagram showing the arrangement of a column address buffer incorporated in the column address decoder/selector sub-system.

FIG. 6 illustrates the circuit arrangement of the column address buffer 151a, and comprises an adder ADD, delay-flip flop circuits DFF1, DFF2 DFF3 and DFF4, OR gates OR1, OR2, OR3, OR4, OR5, and OR6 AND gates AD1, AD2, AD3 and AD4, inverters IV1, IV2, IV3 and IV4, and switching elements SW1, SW2, SW3, SW4, SW5, SW6, SW7, SW8, SW9 and SW10 each implemented by a parallel combination of n-channel type and p-channel type field effect transistors, exclusive-OR gates EX1, EX2, EX3 and EX4, NAND gates ND10 and ND11 and buffer elements BF1 and BF2, and the adder ADD is constituted by an inverter IV5 and an exclusive-OR gate EX5.

An internal control signal CTL11 is supplied from the internal timing generator 180 to the delay-flip-flop circuits DFF1 and DFF2, and the delay-flip-flop circuits DFF1 and DFF2 latch the lower two column address bits CLM0 and CLM1 of the internal column address signal in response to the internal control signal CTL11. Internal control signals CTL12 and CTL13 are further supplied to the OR gates OR3/OR5 and the NAND gates AD1/AD3, respectively, and internal control signals CTL14, CTL15, CTL16 and CTL17 are ORed at the OR gate OR1. The internal control signals CTL15 to CTL17 are further ORed at the OR gate OR6, and the internal control signals CTL12 to CTL17 changes propagation paths of the lower two column address bits CLM0 and CLM1 through the adder ADD to the output buffers BF1 and BF2. The internal control signals CTL18, CTL19, CTL20, CTL21, CTL22 and CTL23 are further supplied from the internal timing generator 180 to the gates of the switching elements SW3 to SW5 and SW8 to SW10, and the switching elements SW3 to SW5 and SW8 to SW10 selectively transfer the lower column address bits CLM0 and CLM1 and the complementary bits thereof.

Internal control signals CTL24 and CTL25 are further supplied from the internal timing generator 180 to the adder ADD, and the adder ADD produces the complementary bits of the lower two column address bits CLM0 and CLM1. In other words, the adder ADD increments the value indicated by the lower two column address bits, and the switching elements SW3 to SW5 and SW8 to SW10 transfer the lower two column address bits and the incremented column address bits in the sequential or interleave manner.

Figure 7:
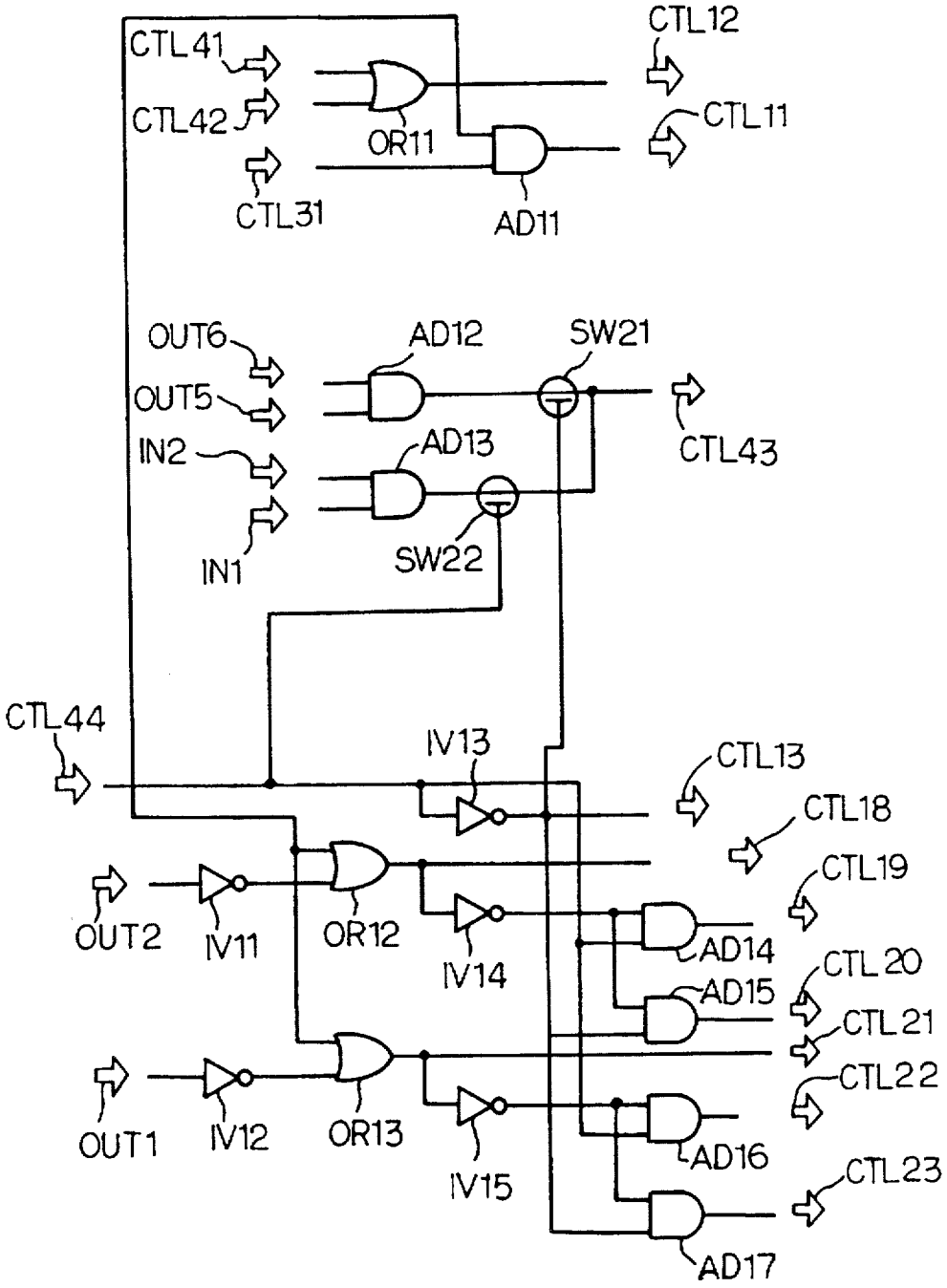
FIG. 7 is a circuit diagram showing the arrangement of a part of an internal timing generator incorporated in the synchronous dynamic random access memory device according to the present invention.

Turning to FIG. 7 of the drawings, a part of the internal timing generator 180 comprises OR gates OR11, OR12 and OR13, AND gates AD11, AD12, AD13, AD14, AD15, AD16 and AD17 inverters IV11, IV12, IV13, IV14 and IV15 and switching elements SW21 and SW22, and produces the internal control signals CTL11 to CTL13 and CTL18 to CTL23. CTL41 to CTL44 are indicative of internal control signals, and are used in description on a read-out sequence hereinlater.

Figure 8A:
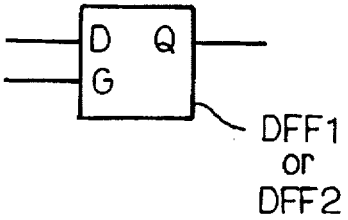
FIG. 8A is a view showing the symbol of a delay-flip-flop circuit incorporated in the synchronous dynamic random access memory device according to the present invention.
Figure 8B:
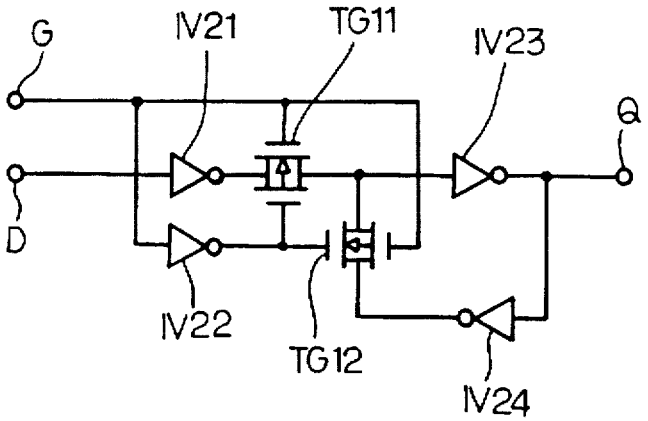
FIG. 8B is a circuit diagram showing the arrangement of the delay-flip-flop circuit represented by the symbol shown in FIG. 8A.

The delay-flip flop circuits DFF1 and DFF2 are symbolized by a box with "D", "G" and "Q" as shown in FIG. 8A, and each of the delay-flip flop circuits DFF1 and DFF2 comprises four inverters IV21, IV22, IV23 and IV24 and two transfer gates TG11 and TG12. The behavior of the delay-flip-flop circuit is known to a person skilled in the art, and no further description is incorporated hereinbelow for the sake of simplicity.

Figure 9A:
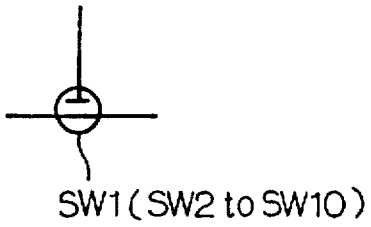
FIG. 9A is a view showing the symbol of a switching element incorporated in the synchronous dynamic random access memory device according to the present invention.
Figure 9B:
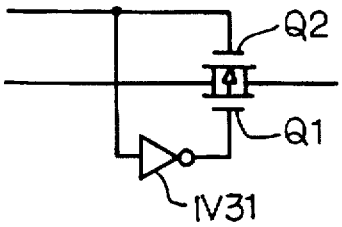
FIG. 9B is a circuit diagram showing the arrangement of the switching element.

The switching elements SW1 to SW10 are symbolized as shown in FIG. 9A, and each of the switching elements SW1 to SW10 is implemented by a parallel combination of p-channel type and n-channel type field effect transistors Q1/Q2 associated with an inverter IV31 as shown in FIG. 9B. The behavior of the switching element is also known to a person skilled in the art, and detailed description is omitted from the description.

Turning back to FIG. 5 of the drawings, each of the column address decoder/selector units 1510 to 1513 comprises a first column address decoder 150a operative to decode lower column address bits for producing a first column address decoded signal DC1, a second column address decoder 150b operative to decode higher column address bits for producing a second column address decoded signal DC2, a latch circuit 150c responsive to an internal control signal CTL32 for storing the first column address decoded signal DC1 produced by the associated first column address decoder 150a, a read-out/write-in circuit 150d for amplifying and transferring a read-out data bit and a write-in data bit from and to the associated bit line pair and a switching unit 150e enabled with the internal control signal CTL32 and responsive to the second column address decoded signal DC2 for transferring the read-out and write-in data bit between the input/output sub-unit 161 and the associated read-out/write-in circuit 150d. The first column address decoder 150a and the second column address decoder 150b are respectively implemented by a NAND gate and an AND gate. The read-out/write-in circuit 150d comprises a read amplifier 150f for developing a potential difference indicative of the read-out data bit, a read-out circuit 150g responsive to the first column address decoded signal DC1 for transferring the read-out data bit to the read-out amplifier 150f, a write-in amplifier 150h for developing a potential difference indicative of the write-in data bit, and a write-in circuit 150i responsive to the first column address decoded signal for transferring the write-in data bit from the write-in amplifier 150h to the associated bit line pair.

The input/output sub-unit 161 comprises a single data line pair 161a shared between the switching elements 150e of the first column address decoder/selector sub-units of the respective column address decoder/selector units 1510 to 1513, a pair of delay-flip-flop circuits DFF5 and DFF6 coupled with the single data line pair 161a, an output buffer circuit 161b for sequentially changing an output data signal indicative of the read-out data bits, an input data buffer 160c for storing an input data signal indicative of the write-in data bit, a data latch circuit 160d responsive to an internal control signal CTL34 for storing the input data signal and a data latch circuit 160e for supplying a potential difference indicative of the write-in data bit to the single data line pair.

In this instance, the pair of delay-flip flop circuits DFF5/DFF6, the output buffer circuit 161b, the input data buffer 160c, the data latch circuit 160d and the data latch circuit 160e form in combination an interface unit, and the latch circuit 150c, the switching element 150e and the pair of delay-flip-flop circuit DFF5/DFF6 provide a plurality of pipeline stages.

The column address decoder/selector units 1510 to 1513 are coupled through the single data line pair 161a with the associated interface unit, and the arrangement of the data lines is simpler than that of the prior art synchronous dynamic random access memory device.

Figure 10:
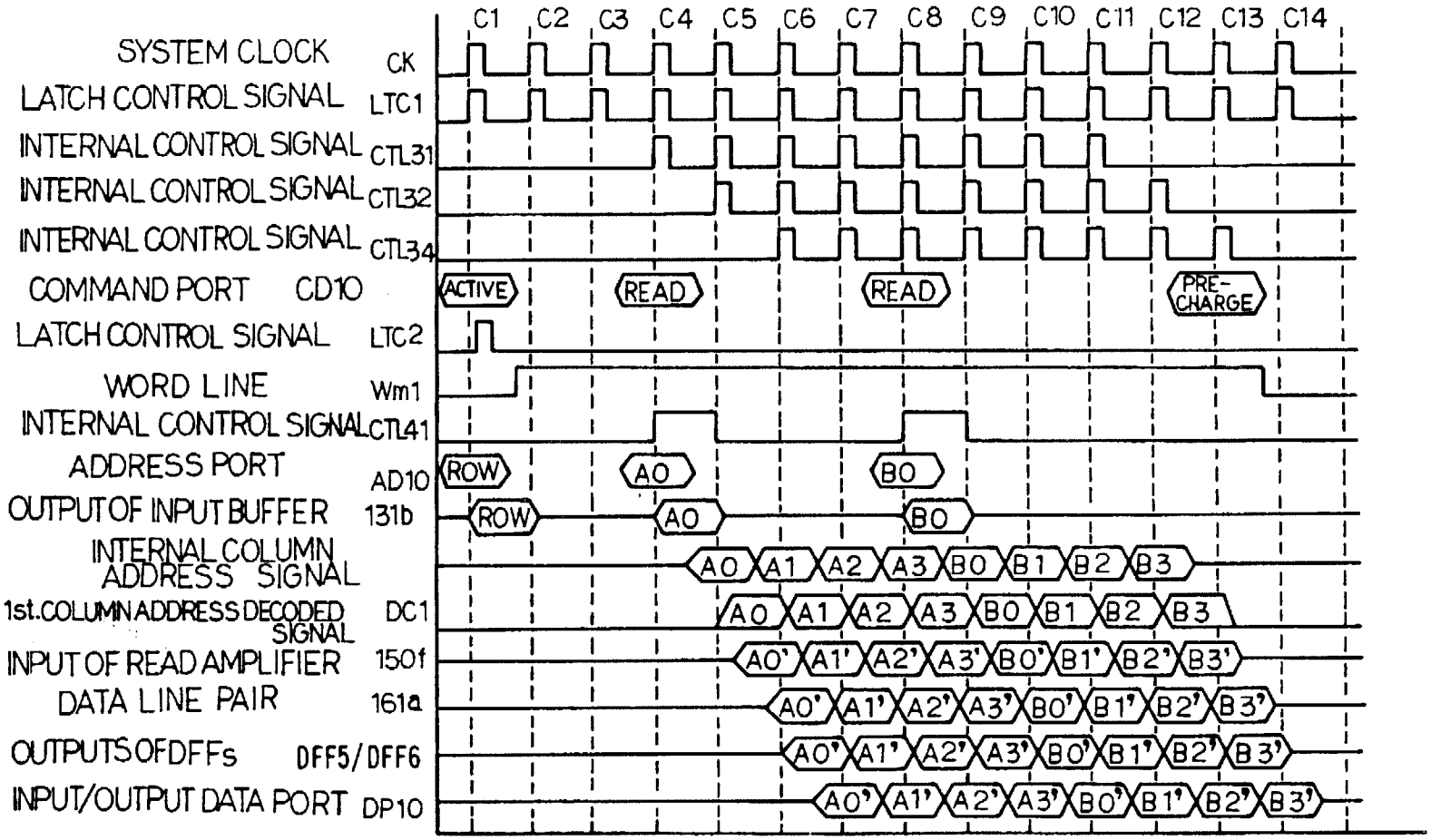
FIG. 10 is a timing chart showing the read-out sequence in a sequential burst carried out by the synchronous dynamic random access memory device according to the present invention.
Figure 11:
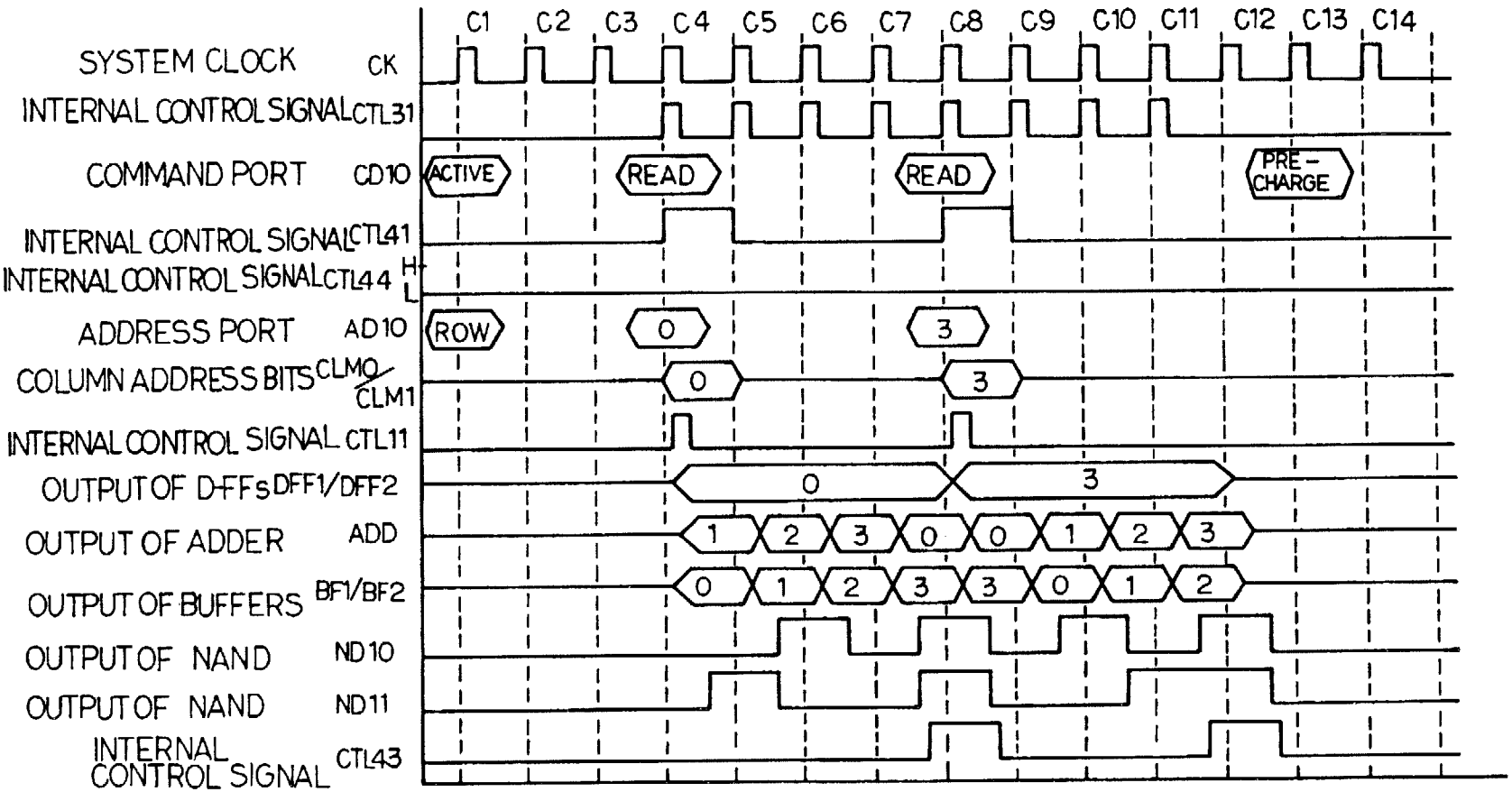
FIG. 11 is a timing chart showing the read-out sequence in a sequential burst carried out by the synchronous dynamic random access memory device according to the present invention.
Figure 12:
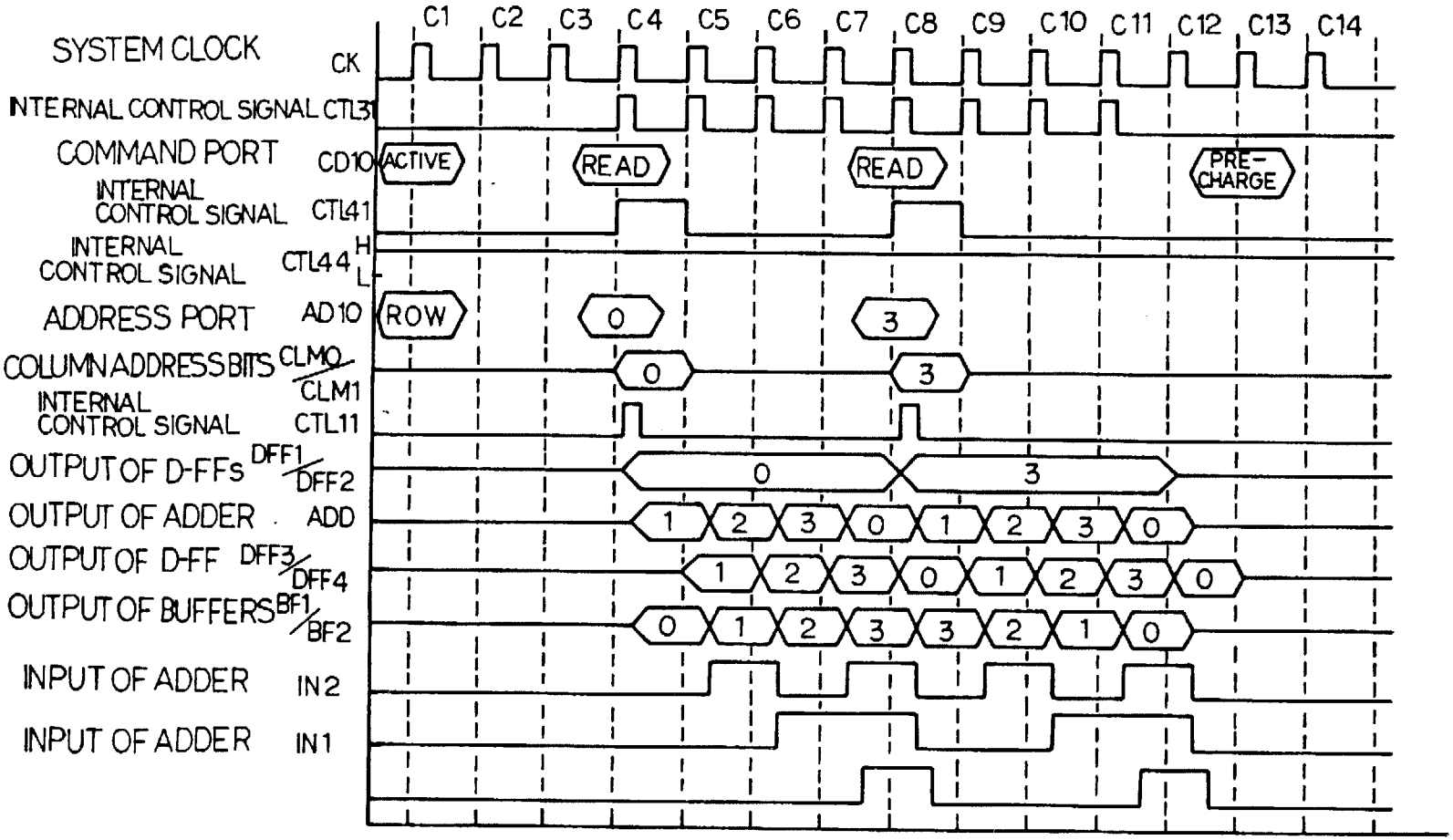
FIG. 12 is a timing chart showing the read-out sequence in an interleave burst carried out by the synchronous dynamic random access memory device according to the present invention.

The synchronous dynamic random access memory device thus arranged behaves in the read-out mode as follows. FIG. 10 illustrates a read-out sequence, and FIGS. 11 and 12 show circuit behaviors of the part of internal timing generator and the column address decoder/selector units 1510 to 151n in a sequential burst and in an interleave burst. The column address decoder/selector units 1510 to 1513 and the input/output unit 160 are pipelined, and the latch circuits 150c, the switching elements 150e and the delay-flip flop circuits DFF4/DFF5 split the flow of the read-out data bits into three pipeline stages. C1 to C14 are indicative of the leading edges of the system clock CK.

Although data bits are read-out from the memory cell arrays 110 to 11n in parallel through the column address decoder/selector units 1510 to 1513 and the input/output unit 160 to the input/output data port DP10, description is made on the memory cell array 110 only on the assumption that the external row and column address signals are indicative of the row and column addresses assigned to the memory cell Mm1.

If the microprocessor (not shown) supplies the external row address signal ROW and the external command signal ACTIVE to the address port AD10 and the command port CD10 at C1, the internal timing generator 180 starts the row addressing sequence, and the row address decoder/word line driver 141c energizes the word line Wm1 as similar to the prior art row addressing system. As a result, data bits are read out from the memory cells Mm1 to Mmn to the bit line pairs BL11 to BL1n, and small potential differences take place on the bit line pairs BL11 to BL1n. The sense amplifiers SA1 to SAn develops the small potential differences, and the bit line pairs BL11 to BL1n propagate the potential differences to the column address decoder/selector units 1510 to 151n.

If the external command signal READ and the external column address signal are supplied to the command port CD10 and the address port AD10 at C4, the internal column address signal A0 is latched by the column address buffer units 151a and 151b, and the first column address decoder 150a of the column address decoder/selector unit 1510 changes the first column address decoded signal DC1 to the low level.

The internal timing generator 180 supplies the one-shot internal control signal CTL32 to the latch circuit 150c at C5, and the first column address decoded signal DC1 is stored in the latch circuit 150c. As a result, the read-out data bit on the bit line pair BL11 is transferred through the read-out/write-in circuit 150d to the read amplifier 150f, and the read-out data bit is amplified by the read amplifier 150f.

Assuming now that the lower two column address bits are logic "1" level or high level, the second column address decoder 150b of the column address decoder/selector unit 1510 enters into ready for turn-on state, and the read-out data bit A0' transferred from the bit line BL11 is in turn transferred from the column address decoder/selector unit 1510 to the signal data line pair 161a at C6. Thus, the switching element 150e realizes the second pipeline stage, and introduce time delay equivalent to one system clock pulse into the read-out sequence at selection of the switching elements 150e. While the single data line pair 161a is propagating the read-out data bit A0', the other switching elements 150e are turned off, and prevent the data line pair 161a from the other read-out data bits transferred from the other bit line pairs.

The first column address buffer unit 151a increments the value represented by the lower two column address bits to A1 at C5, and the lower column address bits thus incremented are decoded at the first column address decoder 150a, and the first column address decoded signal DC1 is transferred to the input node of the latch circuit 150c.

The one-shot internal control signal CTL34 is supplied to the pair of delay-flip-flop circuits DFF5/DFF6 at C6, and the read-out data bit A0' is stored in the delay flip-flop circuits DFF5/DFF6. The read-out data bit A0' is transferred from the pair of delay-flip-flop circuits DFF5/DFF6 to the output data buffer 161b.

At C6, the first column address decoded signal DC1 indicative of A1 is latched by the latch circuit 150c, and the read-out data bit A1' is amplified and transferred through the switching element 150e to the single data line pair 161a. Moreover, the first column address buffer unit 151a further increments the value represented by the lower two column address bits to A2, and transfers the lower two column address bits to the latch circuit 150c.

Thus, the read-out data bits A0' to A3' are sequentially transferred through the column address decoder/selector units 1510 to 1513, the single data line pair 161a and the input/output sub-unit 161 to the input/output port DP10, and supplied to the outside of the synchronous dynamic random access memory device.

In the write-in sequence, the single data line pair 161a is shared between the switching elements 150e of the column address decoder/selector units 1510 to 1513.

If the synchronous dynamic random access memory device selects the sequential burst, the internal control signal CTL44 is fixed to the low level as shown in FIG. 11. When the external command codes READ or WRITE is latched, the internal control signal CTL41 or CTL42 are changed to the high level during the clock cycle thereof. Since the internal control signal CTL41/CTL42 is ANDed with the internal control signal CTL31, the one-shot clock signal CTL11 is produced in the clock cycle. With the internal control signal CTL11, the lower two column address bits CLM0 and CLM1 are stored in the delay-flip-flop circuits DFF1 and DFF2. The lower two column address bits CLM0 and CLM1 take place at the nodes Q of the delay-flip-flop circuits DFF1 and DFF2. In the clock cycle starting at C4, the internal control signal CTL41 keeps high, and, for this reason, the internal control signal CTL12 is maintained at the high level. As a result, the internal control signals CTL18 and CTL21 are changed to the high level, and the internal control signals CTL19, CTL20, CTL22 and CTL23 are changed to the low level. For this reason, the lower two column address bits CLM0 and CLM1 at the nodes Q pass through the switching elements SW3 and SW8, and reach the buffers BF1 and BF2. In other words, the lower two address bits CLM0 and CLM1 are directly output from the first column address buffer unit 151a.

The internal control signals CTL14 to CTL17 are indicative of the burst lengths of 1, 2, 4 and 8. In this instance, the burst length is adjusted to 4, and, accordingly, only the internal control signal CTL16 is maintained at the high level. The other internal control signals CTL14, CTL15 and CTL17 are in the low level. The output nodes of the OR gates OR1 and OR6 are changed to the high level, and the internal control signal CTL13 is in the high level because of the internal control signal CTL44 is fixed at the low level. The internal control signal CTL12 is in the high level in the clock cycle starting at C4, and the column address bits CLM0 and CLM1 at the nodes Q are supplied to the adder ADD as the input signals IN2 and IN1. The column address bits CLM0 and CLM1 are assumed to be "0" represented by zero bits . The adder ADD changes the column address bits to "1" and "0" indicating the incremented value "1".

In the next clock cycle starting at C5, the clock signal CK causes the delay-flip-flop circuits DFF3 and DFF4 to transfer the column address bits indicative of the incremented value "1" to the output nodes Q. Since the internal control signal CTL41 and the internal control signal CTL44 are in the low level in the sequential burst, the internal control signals CTL18 and CTL21 are in the low level, and the internal control signals CTL20 and CTL23 are in the high level. As a result, the column address bits at the nodes Q of the delay-flip-flop circuits DFF3 and DFF4 are transferred through the switching elements SW5 and SW10 to the buffers BF1 and BF2, respectively. Thus, the value of the lower two address bits CLM0 is incremented by one. Since the internal control signal CTL12 is changed to the low level, the switching elements SW1 and SW6 turn off, and the switching elements SW2 and SW7 turn on. For this reason, the column address bits indicative of the incremented value "1" are supplied to the adder ADD as the input signals IN1 and IN2, and the adder ADD produces the column address bits indicative of "2". In other words, the output of the inverter IV5 and the output of the exclusive-OR gate EX5 are changed to bit "0" and bit "1", respectively.

Thus, the value of the column address bits CLM0 and CLM1 are sequentially incremented by one in synchronism with the clock signal CK in the sequential burst.

In the clock cycle starting at C7, the output of the inverter IV5 and the output of the exclusive-OR gate EX5 are matched with the initial column address bits stored in the delay-flip-flop circuits DFF1 and DFF2. As a result, the outputs of the exclusive-OR gates EX1 and EX3 are changed to the low level, and the outputs of the NAND gates ND10 and ND11 are changed to the high level. Since the internal control signal CTL13 is in the high level, the internal control signal CTL43 is changed to the high level, and the internal control signal CTL43 is indicative of the completion of the sequential burst access.

If the synchronous dynamic random access memory device selects the interleave burst, the internal control signal CTL44 is fixed to the high level as shown in FIG. 12. If the external command code READ is latched by the command register unit 170, the lower two column address bits CLM0 and CLM1 are transferred to the buffers BF1 and BF2 without increment in the clock cycle starting at C4. However, since the internal control signal CTL13 is changed to the low level, the input signals to the adder ADD are in the low level, i.e., value "0", and the output of the adder is incremented to "1".

In the clock cycle starting at C5, the clock signal CK causes the delay-flip-flop circuits DFF3 and DFF4 to transfer the bits indicative of value "1" at the nodes Q thereof. The internal control signal CTL41 is changed to the low level. Since the internal control signal CTL44 is in the high level in the interleave burst, the internal control signals CTL18 and CTL21 are changed to the low level, and the internal control signal CTL19 and CTL22 are changed to the high level. The exclusive-OR gates EX2 and EX4 carry out the exclusive-OR operations on the column address bits stored in the delay-flip-flop circuits DFF1 and DFF2 and the incremented column address bits indicative of "1"and the outputs of the exclusive-OR gates EX2 and EX4 are transferred through the switching elements SW4 and SW9 to the buffers BF1 and BF2. Thus, the initially supplied column address bits are exclusive-ORed with the incremented bits indicative of "1" and the result of the exclusive-OR operation is transferred to the first column address decoder 150a.

Since the internal control signal CTL12 is in the low level, the switching elements SW1 and SW6 are turned off, and the switching elements SW2 and SW7 are turned on. For this reason, the bits indicative of value "1" is supplied to the adder ADD, and the adder ADD increments the bits to "2". Thereafter, the column address bits initially supplied thereto are exclusive-ORed with the bits indicative of value "2" in the second cycle and with the bits indicative of value "3" in the third cycle.

In the clock cycle starting at C7, the input signals IN1 and IN2 are in the high level indicative of value "3". Since the internal control signal CTL44 is in the high level, the internal control signal CTL43 is changed to the high level indicative of the completion of the burst access.

In the first bit of the burst access, the delay-flip-flop circuits DFF1 and DFF2 latch the column address bits CLM0 and CLM1 after confirmation whether the external command code is "READ" or "WRITE", and the column address bits are directly output through the switching elements SW3 and SW8 without passing through the adder ADD, thereby accelerating the output.

Although a particular embodiment of the present invention has been shown and described, it will be obvious to those skilled in the art that various changes and modifications may be made without departing from the spirit and scope of the present invention. For example, the present invention is applicable to all the types of semiconductor memory device synchronous with an external clock signal, and the semiconductor memory device according to the present invention may form a part of a large scale integration. The pipeline stages of the column addressing system and the input/output units may be more than three.

What is claimed is:

1. A semiconductor memory device comprising:

a) a memory cell array having plurality of addressable memory cells for storing a plurality of data bits selectively assigned with row addresses and column addresses;

b) a row addressing system responsive to an external row address signal indicative of one of said row addresses for selecting a row of memory cells from said plurality of addressable memory cells;

c) a timing controller for producing a plurality of internal control signals for sequentially supplying data bits selected from said plurality of data bits to outside of said semiconductor memory device;

d) an interface unit coupled with a data port for transferring said data bits to the outside of said semiconductor memory device;

e) a single shared data bus coupled with said interface unit for sequentially propagating said data bits to said interface unit; and f) a column addressing system coupled with said single shared data bus, and having f-1) a column address buffer sub-system operative to store one of said column addresses represented by an external column address signal, and responsive to first internal control signals of said plurality of internal control signals for changing said one of said column addresses a predetermined number of times, and f-2) a column address decoder/selector sub-system forming a plurality of pipeline stages together with said interface unit, said plurality of pipeline stages being responsive to second internal control signals of said plurality of internal control signals so as to successively transfer said data bits, identified by said one of said column addresses and said column addresses changed by said column address buffer sub-system through said single shared data bus to said data port, said column address decoder/selector subsystem comprising a plurality of column address decoder/selector units coupled through said single shared data bus with said interface unit, each of said plurality of column address decoder/selector units having a first column address decoder responsive to lower column address bits for producing a first column address decoded signal, a second column address decoder responsive to higher column address bits for producing a second column address decoded signal, said lower and higher column address bits being indicative of said one of said column addresses and said column addresses changed said predetermined number of times, a latch circuit responsive to one of said second internal control signals for storing said first column address decoded signal, a read amplifier for amplifying one of said data bits, a read-out circuit responsive to said first column address decoded signal stored in said latch circuit for transferring said one of said data bits to said read amplifier, and a switching unit enabled with said one of said second internal control signals and responsive to said second column address decoded signal for transferring said one of said data bits to said single shared data bus, said switching unit and said read-out circuit controlled by said latch circuit forming parts of said plurality of pipeline stages.

2. The semiconductor memory device as set forth in claim 1, in which said column address buffer sub-system sequentially changes said one of said column addresses said predetermined number of times.

3. The semiconductor memory device as set forth in claim 1, in which said interface unit has a pair of flip-flop circuits responsive to another of said second internal control signals for sequentially storing said data bits, said pair of flip-flop circuits forming a part of said plurality of pipeline stages.

*4. A semiconductor memory device, comprising:*

*a memory cell array having a plurality of addressable memory cells for storing a plurality of data bits selectively assigned with addresses;*

*a selection circuit coupled to said memory cells for accessing said memory cells;*

*a buffer circuit supplied with address bits in synchronization with a clock signal;*

*an internal buffer receiving a predetermined number of said address bits;*

*a logic circuit, responsive to said predetermined number of address bits representing a value, for generating an internal set of address bits representing another value in synchronization with said clock signal;*

*an internal output buffer selectively coupled to receive one of: said predetermined number of address bits and said internal set of address bits, via a first switch, said internal output buffer being coupled to said selection circuit, said selection circuit having a first access to said memory cells corresponding to a value of said predetermined number of address bits and second access to said memory cells corresponding to a value of said internal set of address bits; and*

*a control circuit generating control information which is supplied to said first switch to first select said internal buffer supplying said predetermined number of address bits and subsequently to select said logic circuit generating said internal set of address bits, thereby accelerating said first and second accesses to said memory cells.*

*5. The semiconductor memory device as claimed in claim 4, further comprising:*

*a register receiving external information indicating a row of said memory cells, said selection circuit having said first access to one of said memory cells corresponding to said external information and to said address bits from said internal buffer and subsequently said second access to another memory cell corresponding to said external information and to said address bits from said logic circuit.*

*6. The semiconductor memory device as claimed in claim 5, wherein said first access is responsive to said address bits supplied from said internal buffer without passing through said logic circuit.*

*7. The semiconductor memory device as claimed in claim 5, wherein said logic circuit includes an adder to increment said value of said predetermined number of address bits.*

*8. The semiconductor memory device as claimed in claim 7, further comprising a latch circuit associated with said logic circuit and a second switch, said second switch selectively coupling said logic circuit to said internal buffer, an output of said latch circuit further incrementing said predetermined number of address bits and providing corresponding further accesses to said memory cells in sequence.*

*9. The semiconductor memory device as claimed in claim 5, wherein said logic circuit includes an inverter for inverting one bit of said predetermined number of address bits and a logic gate for selectively inverting another bit of said predetermined number of address bits according to a value of said one bit of said predetermined number of address bits.*

*10. The semiconductor memory device as claimed in claim 4, wherein said first switch comprises a parallel combination of n-channel type and p-channel type field effect transistors.*

*11. A semiconductor memory device, comprising:*

*a memory cell array having a plurality of addressable memory cells for storing a plurality of data bits selectively assigned with addresses;*

*a selection circuit coupled to said memory cells for accessing said memory cells;*

*an input buffer receiving address bits;*

*a first address signal path between said input buffer and said selection circuit for providing a first number of said address bits to said selection circuit;*

*a second address signal path between said input buffer and said selection circuit, including a first internal buffer and a second internal buffer, for providing a second number of said address bits to said selection circuit; and*

*a third address signal path between said first internal buffer and said second internal buffer including a first logic gate and a latch for providing said second number of address bits representing address information generated by said first logic gate and different from address information provided on said second address signal path, wherein said selection circuit is responsive to address information from said first address signal path and address information from one of said second and third address signal paths selected in sequence to provide a burst access to said memory cells.*

*12. The semiconductor memory device as claimed in claim 11, wherein address bits in said first internal buffer are directly supplied to said second internal buffer to accelerate said burst access.*

*13. The semiconductor memory device as claimed in claim 11, further comprising a second logic gate for detecting a match between outputs from said first internal buffer and said first logic gate to indicate the end of said burst access.*

*14. The semiconductor memory device as claimed in claim 13, wherein said second logic gate is of exclusive-OR type.*

*15. The semiconductor memory device as claimed in claim 11, wherein said logic gate includes an adder to increment said second number of said address bits and supplies said incremented bits to said latch during a first*

*operational period of the device, said second number of address bits being transferred to said second internal buffer without passing though said adder during said first operational period of the device.*

*16. A semiconductor memory device, comprising:*

*a memory cell array having a plurality of addressable memory cells for storing a plurality of data bits selectively assigned with addresses;*

*a selection circuit coupled to said memory cells for accessing said memory cells;*

*a buffer receiving address bits in synchronization with a clock signal;*

*a signal path, coupled between said buffer and said selection circuit, for selectively transferring said address bits to said selection circuit;*

*a logic circuit, coupled between said buffer and said selection circuit, for incrementing said address bits and selectively transferring the incremented address bits to said selection circuit; and*

*a timing control circuit sequentially selecting, in synchronization with said clock signal, said signal path and said logic circuit to be coupled to said selection circuit for respectively performing a first and a subsequent part of a burst access of said memory cells.*

*17. A semiconductor memory device, comprising:*

*a memory cell array having a plurality of addressable memory cells for storing a plurality of data bits selectively assigned with row addresses and column addresses;*

*a selection circuit providing burst access to said memory cells and being responsive to a plurality of sets of address bits from an internal address path to select columns of memory cells;*

*a buffer receiving one of said sets of address bits; and*

*an address generating circuit,*

*said buffer supplying said one of said sets of address bits to said internal address path and to said address generating circuit in common during a first operation cycle of said burst access, said selection circuit being responsive to said one of said sets of address bits appearing on said internal address path during said first operation cycle and thereby selecting a corresponding one of said columns, said address generating circuit incrementing said one of said sets of address bits received during said first operation cycle and thereby supplying incremented address bits to said internal address path during a second operation cycle of said burst access, said selection circuit being further responsive to said incremented address bits appearing on said internal address path during said second operation cycle and thereby selecting another of said columns.*

*18. The semiconductor memory device as claimed in claim 17, wherein said address generating circuit includes a first circuit portion for inverting a low bit of address bits supplied thereto and a second circuit portion for selectively inverting a high bit of address bits supplied thereto according to a value of said low bit, said first and second circuit portions being selectively enabled during said burst access according to internal control information indicating a burst length.*

*19. The semiconductor memory device as claimed in claim 18, further comprising a logic gate comparing an output from said buffer and an output from said address generating circuit to indicate an end of said burst access.*

*20. The semiconductor memory device as claimed in claim 19, further comprising a transfer gate disposed between said buffer and said address path for directly providing said one of sets of address bits during said first operation cycle.*

*21. A semiconductor memory device, comprising:*

*a memory cell array having a plurality of addressable memory cells for storing a plurality of data bits selectively assigned with addresses;*

*a selection circuit coupled to said memory cells for accessing said memory cells;*

*an input port supplied with address bits;*

*a first address path coupled between said input port and said selection circuit;*

*a second address path coupled between said input port and said selection circuit, said second address path including a logic circuit to logically change at least one of said address bits; and*

*a switch selectively coupling said first address path and said second address path to said selection circuit in sequence, thereby causing said selection circuit to access said memory cells in sequence.*

*22. The semiconductor memory device as claimed in claim 21, wherein said second address path further includes a latch and said logic circuit includes an adder, an input of said latch being coupled to an output of said adder, and an output of said latch being coupled to an input of said adder, said adder and said latch causing said address bits to be repeatedly incremented.*

*23. The semiconductor memory device as claimed in claim 21, further comprising a detector responsive to address bits in said first address path and address bits in said second address path to indicate an end of a sequence of accesses.*

*24. A semiconductor memory device, comprising:*

*a memory cell array having a plurality of addressable memory cells for storing a plurality of data bits selectively assigned with addresses;*

*a selection circuit coupled to said memory cells for accessing said memory cells;*

*an input latch receiving an initial set of address bits in response to an external command;*

*an internal latch receiving an incremented set of address bits generated from said initial set of address bits at a first clock cycle of the device;*

*an adder responsive to said internal latch and providing a further incremented set of address bits to said internal latch at each of subsequent cycles prior to another external command being applied to said device, said selection circuit accessing said memory cells according to said initial, incremented and further incremented sets of address bits in sequence; and*

*an address signal path in parallel with said internal latch and said adder for transferring said initial set of address bits to said selection circuit during said first clock cycle.*

*25. A semiconductor memory device, comprising:*

*a memory cell array having a plurality of addressable memory cells for storing a plurality of data bits selectively assigned with addresses;*

*an incrementer for generating internal address bits in sequence;*

*a selection circuit coupled to said memory cells for providing burst access to said memory cells in response to said internal address bits in sequence;*

*a burst end detector coupled to said incrementer and responsive to reference bits, said incrementer performing in common generation of said internal address bits and detection of an end of said burst access.*

*26. The semiconductor memory device as claimed in claim 25, wherein said incrementer is synchronized with a system clock.*

*27. A semiconductor memory device, comprising:*

*a memory cell array having a plurality of addressable memory cells for storing a plurality of data bits selectively assigned with row addresses and column addresses;*

*a control circuit indicating one of a first burst access and a second burst access of said memory cells;*

*a selection circuit responsive to a plurality of sets of address bits from an internal address path to select columns of memory cells;*

*a buffer receiving one of said sets of address bits;*

*an address generating circuit including an incrementer, said buffer supplying said one of said sets of address bits to said internal address path and to said address generating circuit in common during a first operation cycle of each of said first and second burst accesses, said selection circuit being responsive to said one of said sets of address bits appearing on said internal address path during said first operation cycle and thereby selecting a corresponding one of said columns, said address generating circuit incrementing, during said first burst access, said one of said sets of address bits received during said first operation cycle and thereby supplying incremented bits to said internal address path during a second operation cycle of said first burst access, said selection circuit being further responsive to said incremented bits appearing on said internal address path during said second operation cycle and thereby selecting another of said columns;*

*a first gate circuit enabled during said second burst access for supplying predetermined bits to said address generating circuit, said address generating circuit incrementing said predetermined bits; and*

*a second gate circuit enabled during said second burst access responsive to an output from said buffer and an output from said address generating circuit for providing output bits to said internal address path during a second operation cycle of said second burst access, said selection circuit being further responsive to said output bits and thereby selecting a column other than said one of said columns.*

*28. A semiconductor memory device, comprising:*

*a memory cell array having a plurality of addressable memory cells for storing a plurality of data bits selectively assigned with addresses, wherein said memory cells are accessed during a sequential burst wherein internal address bits are sequentially incremented beginning with initial address bits provided externally and during an interleave burst wherein internal address bits are generated in a logic circuit responsive to said initial address bits and a sequence of incremented bits beginning with predetermined bits;*

*an incrementer associated with an input gate for setting an initial value of said incrementer according to said initial address bits during said sequential burst and according to said predetermined bits during said interleave burst, said incrementer being further associated with an output gate selectively supplying output bits from said incrementer to said logic circuit during said interleave burst, said logic circuit being responsive to said initial address bits, said incrementer thereby providing internal address bits of the device in common in said sequential burst and said interleave burst.*

*29. A method for accessing a semiconductor memory device, comprising steps of:*

*a) applying a command to said memory device to incorporate a set of address bits;*

*b) applying said set of address bits to a logic circuit;*

*c) changing said set of address bits to generate another set of address bits in said logic circuit;*

*d) applying said set of address bits to a selector without passing through said logic circuit;*

*e) selecting one of an array of memory cells according to said set of address bits in step d);*

*f) applying said another set of address bits to said selector; and*

*g) selecting another of said memory cells according to said another set of address bits in step f).*

*30. The method as claimed in claim 29, further comprising steps of:*

*h) incrementing in said logic circuit an applied set of address bits to generate an output set of incremented address bits;*

*i) applying said output set to said logic circuit;*

*j) selecting another one of said memory cells according to said output set in step h)*

*k) repeating steps h), i) and j);*

*l) comparing said address bits in step a) with said incremented address bits in step h); and*

*m) indicating in response to step l) an end of a burst access.*

* * * * *